US007072620B2

(12) United States Patent
Tran

(10) Patent No.: US 7,072,620 B2
(45) Date of Patent: Jul. 4, 2006

(54) SYSTEM AND METHOD FOR REGULATING ANTENNA ELECTRICAL LENGTH

(75) Inventor: Allen Tran, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 106 days.

(21) Appl. No.: 10/407,966

(22) Filed: Apr. 3, 2003

(65) Prior Publication Data

US 2004/0246189 A1 Dec. 9, 2004

(51) Int. Cl.

| | |
|---|---|
| ***H04B 1/40*** | (2006.01) |
| ***G01R 29/10*** | (2006.01) |
| ***H01Q 1/00*** | (2006.01) |
| ***H01Q 1/50*** | (2006.01) |

(52) U.S. Cl. ........................ 455/77; 343/703; 343/905; 343/906

(58) Field of Classification Search ................ 343/703, 343/823, 846, 850, 876, 904–906; 455/73, 455/77–78; 342/128, 130
See application file for complete search history.

(56) References Cited

U.S. PATENT DOCUMENTS 3,419,869 A 12/1968 Altmayer .................... 343/703
3,689,928 A 9/1972 Felsenheld .................. 343/703
5,225,847 A * 7/1993 Roberts et al. ............. 343/745
5,701,595 A * 12/1997 Green, Jr. .................... 455/83
6,501,427 B1 12/2002 Lilly et al. ........... 343/700 MS
6,529,749 B1 3/2003 Hayes et al. ............. 455/575.7
6,657,595 B1 * 12/2003 Phillips et al. .............. 343/702
6,708,044 B1 * 3/2004 Puknat et al. ............ 455/552.1

FOREIGN PATENT DOCUMENTS

EP 1220354 A2 3/2002
EP 1220354 A3 3/2002
WO WO 01/71940 A2 9/2001

* cited by examiner

*Primary Examiner*—Thuy Vinh Tran

(57) ABSTRACT

A system and method are provided for regulating the electrical length of an antenna. The method comprises: communicating transmission line signals at a predetermined frequency between a transceiver and an antenna; sensing transmission line signals; and, modifying the antenna electrical length in response to sensing the transmission line signals. Sensing transmission line signals typically means sensing transmission line signal power levels. In some aspects, the antenna impedance is modified. Alternately, it can be stated that the transmission line signal strength is optimized between the transceiver and the antenna. More specifically, communicating transmission line signals at a predetermined frequency between a transceiver and an antenna includes accepting the transmission line signal from the transceiver at an antenna port. Then, sensing transmission line signals includes measuring the transmission line signal reflected from the antenna port.

32 Claims, 4 Drawing Sheets

SYSTEM AND METHOD FOR REGULATING ANTENNA ELECTRICAL LENGTH

RELATED APPLICATIONS

This application relates to a patent application entitled, MICROELECTROMECHANICAL SWITCH (MEMS) ANTENNA invented by Allen Tran, filed Apr. 03, 2003, Ser. No. 10/407,606, which is now U.S. Pat. No. 6,924,766.

This application relates to a pending patent application entitled MICROELECTROMECHANICAL SWITCH (MEMS) ANTENNA, invented by Allen Tran, filed Feb. 21, 2003, Ser. No. 10/371,792, which is now pending.

This application relates to a patent application entitled, MICROELECTROMECHANICAL SWITCH (MEMS) ANTENNA ARRAY, invented by Allen Tran, filed Feb. 21, 2003, Ser. No. 10/371,564, which is now U.S. Pat. No. 6,888,505.

This application relates to a patent application entitled, FERROELECTRIC ANTENNA AND METHOD FOR TUNING SAME, invented by Stanley Toncich and Allen Tran, Ser. No. 10/117,628, filed Apr. 4, 2002, which is now U.S. Pat. No. 6,861,985.

This application relates to a patent application entitled, INVERTED-F FERROELECTRIC ANTENNA, invented by Stanley Toncich, Allen Tran and Jordi Fabrega, Ser. No. 10/120,603, filed Apr. 9, 2002, which is now U.S. Pat. No. 6,885,341.

BACKGROUND OF THE INVENTION

1. Field of the Invention

This invention generally relates to wireless communication antennas and, more particularly, to a system and method for regulating the operating frequency of a portable wireless communications device antenna.

2. Description of the Related Art

The size of portable wireless communications devices, such as telephones, continues to shrink, even as more functionality is added. As a result, the designers must increase the performance of components or device subsystems while reducing their size, or placing these components in less desirable locations. One such critical component is the wireless communications antenna. This antenna may be connected to a telephone transceiver, for example, or a global positioning system (GPS) receiver.

Wireless telephones can operate in a number of different frequency bands. In the US, the cellular band (AMPS), at around 850 megahertz (MHz), and the PCS (Personal Communication System) band, at around 1900 MHz, are used. Other frequency bands include the PCN (Personal Communication Network) at approximately 1800 MHz, the GSM system (Groupe Speciale Mobile) at approximately 900 MHz, and the JDC (Japanese Digital Cellular) at approximately 800 and 1500 MHz. Other bands of interest are GPS signals at approximately 1575 MHz and Bluetooth at approximately 2400 MHz.

Conventionally, good communication results have been achieved using a whip antenna. Using a wireless telephone as an example, it is typical to use a combination of a helical and a whip antenna. In the standby mode with the whip antenna withdrawn, the wireless device uses the stubby, lower gain helical coil to maintain control channel communications. When a traffic channel is initiated (the phone rings), the user has the option of extending the higher gain whip antenna. Some devices combine the helical and whip antennas. Other devices disconnect the helical antenna when the whip antenna is extended. However, the whip antenna increases the overall form factor of the wireless telephone.

It is known to use a portion of a circuitboard, such as a dc power bus, as an electromagnetic radiator. This solution eliminates the problem of an antenna extending from the chassis body. Printed circuitboard, or microstrip antennas can be formed exclusively for the purpose of electromagnetic communications. These antennas can provide relatively high performance in a small form factor.

Since not all users understand that an antenna whip must be extended for best performance, and because the whip creates an undesirable form factor, with a protrusion to catch in pockets or purses, chassis-embedded antenna styles are being investigated. That is, the antenna, whether it is a whip, patch, or a related modification, is formed in the chassis of the phone, or enclosed by the chassis. While this approach creates a desirable telephone form factor, the antenna becomes more susceptible to user manipulation and other user-induced loading effects. For example, an antenna that is tuned to operate in the bandwidth between 824 and 894 megahertz (MHz) while laying on a table, may be optimally tuned to operate between 790 and 830 MHz when it is held in a user's hand. Further, the tuning may depend upon the physical characteristics of the user and how the user chooses to hold and operate their phones. Thus, it may be impractical to factory tune a conventional chassis-embedded antenna to account for the effects of user manipulation.

It would be advantageous if the antenna of a wireless communication device could be monitored and modified to operate at maximum efficiency.

It would be advantageous if a wireless device could sense degradations in antenna tuning, due to effect of user manipulation for example.

It would be advantageous if the wireless device antenna tuning could be modified in response to sensing the effects of user manipulation or other antenna detuning mechanisms.

SUMMARY OF THE INVENTION

The present invention describes a wireless communication device system and method for sensing the electrical length of an antenna. That is, the device senses antenna detuning, in response to user manipulation for example. Using the sensed information the device modifies characteristics of the antenna, to "move" the antenna, optimizing the tuning at its intended operating frequency.

Accordingly, a method is provided for regulating the electrical length of an antenna. The method comprises: communicating transmission line signals at a predetermined frequency between a transceiver and an antenna; sensing transmission line signals; and, modifying the electrical length of the antenna in response to sensing the transmission line signals. Sensing transmission line signals typically means sensing transmission line signal power levels.

In some aspects, modifying the electrical length of the antenna in response to sensing the transmission line signals includes modifying the antenna impedance. Alternately, it can be stated that modifying the electrical length of the antenna includes optimizing the transmission line signal strength between the transceiver and the antenna.

More specifically, communicating transmission line signals at a predetermined frequency between a transceiver and an antenna includes accepting the transmission line signal from the transceiver at an antenna port. Then, sensing transmission line signals includes measuring the transmission line signal reflected from the antenna port.

In some aspects of the method, the antenna includes a radiator, a counterpoise, and a dielectric proximately located with the radiator and the counterpoise. Then, modifying the electrical length of the antenna in response to sensing the transmission line signals includes changing the dielectric constant of the dielectric. In some aspects, the antenna dielectric includes a ferroelectric material with a variable dielectric constant.

Alternately, the antenna includes a radiator with at least one selectively connectable microelectromechanical switch (MEMS). Then, modifying the electrical length of the antenna in response to sensing the transmission line signals includes changing the electrical length of the radiator in response to connecting the MEMS. In other aspects, a MEMS can be used to change the electrical length of a counterpoise.

Additional details of the above-described method and an antenna system for regulating the electrical length of an antenna are provided below.

DETAILED DESCRIPTION OF THE PREFERRED EMBODIMENTS

Figure 1:
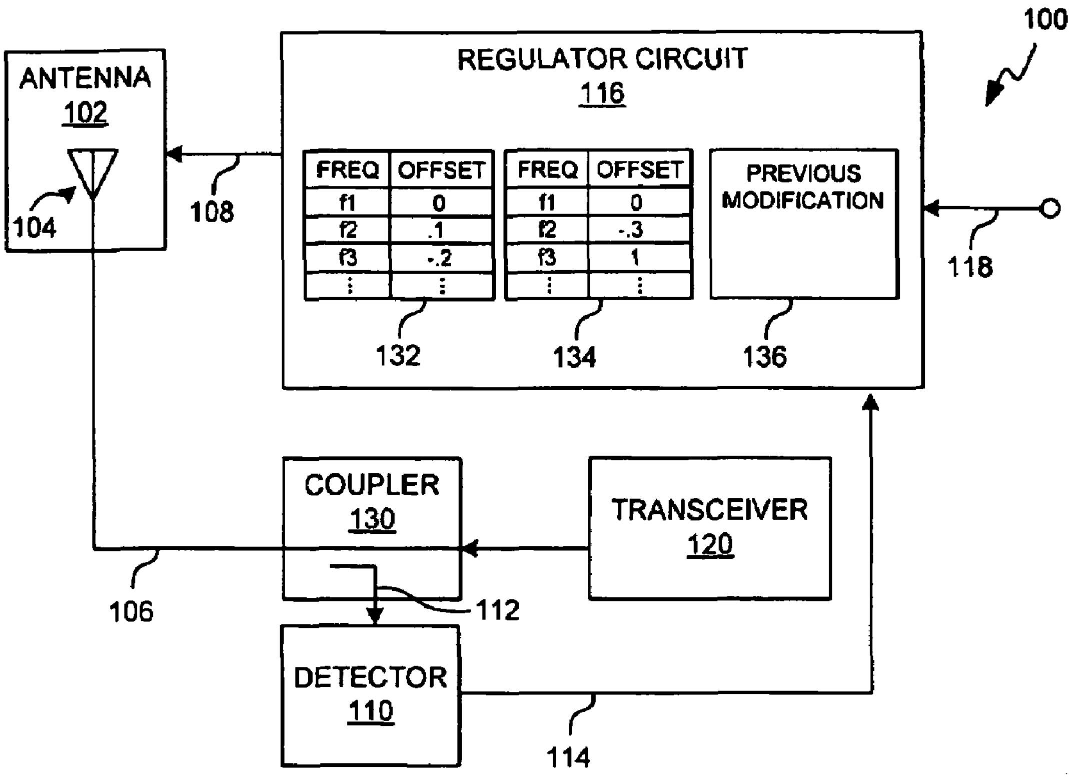
FIG. 1 is a schematic block diagram of the present invention antenna system for regulating the electrical length of an antenna.

FIG. 1 is a schematic block diagram of the present invention antenna system for regulating the electrical length of an antenna. The system 100 comprises an antenna 102 including an active element 104 having an electrical length responsive to a control signal, an antenna port connected to a transmission line 106 to transceive transmission line signals. The antenna 102 has a control port on line 108 that is connected to the active element and accepts control signals. Especially in the context of a wireless telephone system, active element operating frequencies of interest include 824 to 894 megahertz (MHz), 1850 to 1990 MHz, 1565 to 1585 MHz, and 2400 to 2480 MHz. It should be understood that an antenna electrical length has a direct relationship with (optimally tuned) antenna operating frequencies. For example, an antenna designed to operate at a frequency of 1875 MHz may have an effective electrical length of a quarter wavelength of an electromagnetic wave propagating through a medium with a dielectric constant. The electrical length may be considered to be an effective electrical length that is responsive to the characteristics of the proximate dielectric.

A detector 110 has an input on line 112 operatively connected to the transmission line 106 to sense transmission line signals and an output on line 114 to supply detected signals. Operatively connected, as used herein, means either a direct connection or an indirect connection through an intervening element. A regulator circuit 116 has an input connected to the detector output on line 114 to accept the detected signals and a reference input on line 118 to accept a reference signal responsive to the intended antenna electrical length, which is related to the frequency of the conducted transmission line signals on line 106. The regulator circuit 116 has an output connected to the antenna on line 108 to supply the control signal in response to the detected signals and the reference signal. Note that a wireless telephone application of the system 100 may further include filters, duplexers, and isolators (not shown).

In some aspects of the system 100, the antenna port reflects transmission line signals in response to changes in the electrical length of the active element 104. Then, the detector 110 senses transmission line signals reflected from the antenna port on transmission line 106. That is, the antenna port reflects transmission line signals at a power level that varies in response to changes in the electrical length of the active element 104, and the detector 110 senses transmission line signals responsive to changes in the reflected power levels. Alternately stated, the antenna port has an input impedance on transmission line 106 that varies in response to changes in the electrical length, or optimally tuned operating frequency of the active element 104. The detector 110 senses transmission line signals responsive to changes in the antenna port impedance changes. The changes in the electrical length are typically due to changes in the proximate dielectric medium(s). That is, the effective electrical length changes as the dielectric medium near the active element changes. For example, a wireless telephone antenna may have a first electrical length responsive to being placed on a table, and a second electrical length responsive to being held in a user's hand or placed proximate to a user's head. It is the change in the dielectric constant of the surrounding dielectric medium that causes changes in the antenna's electrical length.

Also shown is a transceiver 120 with a port connected to the transmission line 106 to supply a transmission line signal. The detector 110 senses transmission line signals supplied by the transceiver 120 and reflected from the antenna port.

Figure 2:
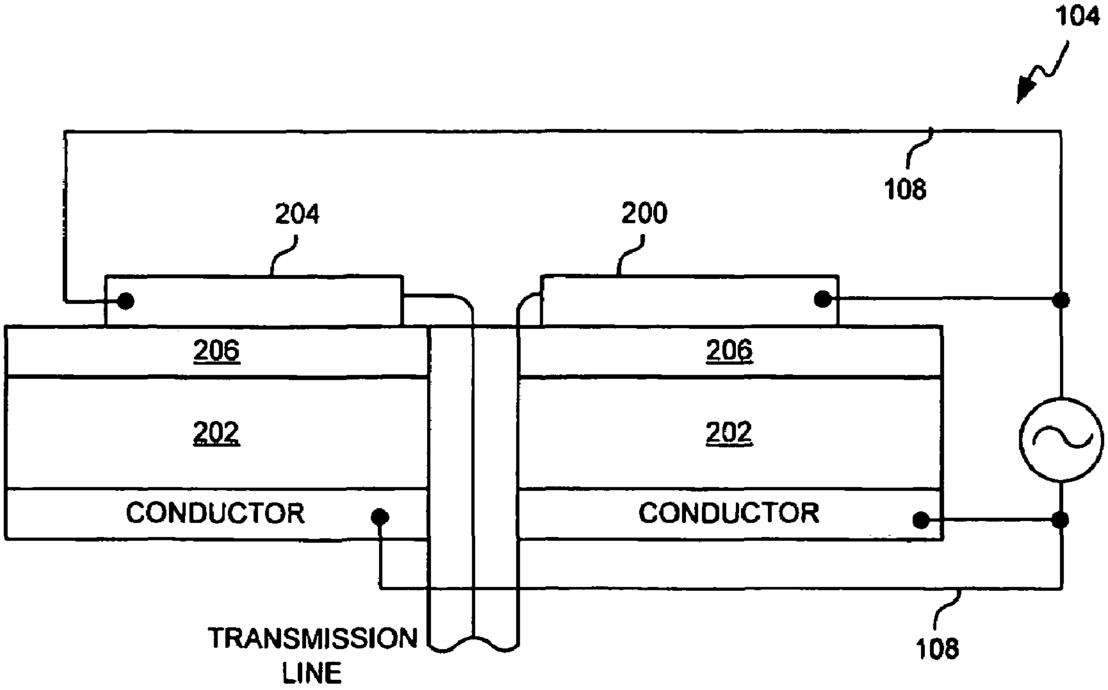
FIG. 2 is a partial cross-sectional view of the antenna of FIG. 1 enabled with a ferroelectric dielectric material.

FIG. 2 is a partial cross-sectional view of the antenna of FIG. 1 enabled with a ferroelectric dielectric material. The active element 104 includes a counterpoise 200 and a dielectric 202, proximately located with the counterpoise 200, with a dielectric constant responsive to the control signal on line 108. The active element also includes a radiator 204 with an electrical length responsive to changes in the dielectric constant. In some aspects, the dielectric 202 includes a ferroelectric material 206 with a variable dielectric constant that changes in response to changes in the control signal voltage levels on line 108.

A dipole antenna is specifically shown where the radiator and counterpoise are radiating elements with an effective electrical length at the antenna electrical length that is an odd multiple of a quarter-wavelength $(2n+1)(\lambda/4)$, where n=0, 1, 2, . . . That is, the wavelength is responsive to the dielectric constant of the proximate dielectric material, and the operating frequency can be modified by changing the dielectric constant. The operating frequencies of monopole and patch antenna can likewise by changed by applying different control signal voltages to (on opposite sides of) the ferroelectric material. An inverted-F antenna can be tuned using a ferroelectric capacitor between the end of the radiator and the groundplane and/or in series to the radiator from the antenna port. Additional details of ferroelectric antenna designs that are suitable for use in the context of the present invention can be found in the applications cited as Related Applications, above. These related applications are incorporated herein by reference.

Figure 3:
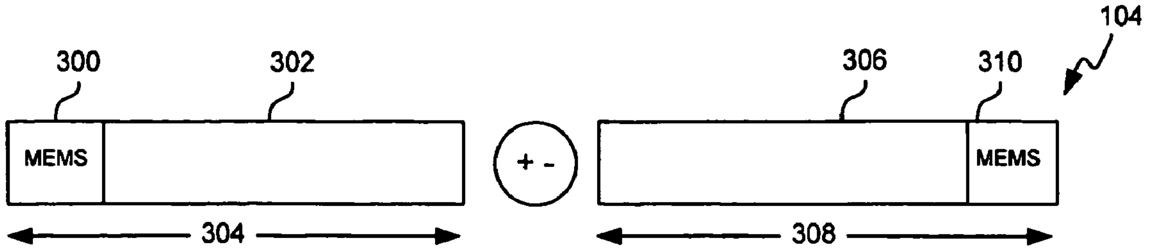
FIG. 3 is a plan view of the antenna of FIG. 1 enabled with a microelectromechanical switch (MEMS).

FIG. 3 is a plan view of the antenna of FIG. 1 enabled with a microelectromechanical switch (MEMS). The active element 104 includes at least one selectively connectable MEMS 300 responsive to the control signal. In one aspect, such as when the active element is a monopole or patch antenna, a radiator 302 has an electrical length 304 that varies in response to selectively connecting the MEMS 300.

In other aspects when the antenna is a dipole, as shown, the antenna active element 104 includes a counterpoise 306 with an electrical length 308 that varies in response to selectively connecting the MEMS 310. Although only a dipole antenna is specifically depicted, the MEMS concept of antenna tuning applies to a wide variety of antenna styles that are applicable to the present invention. The control signal is used to selectively connect or disconnect MEMS sections. Note that although only a single MEMS is shown included as part of radiator 302, the radiator may include a plurality of MEMSs in other aspects. Additional details of MEMS antenna designs can be found in the MICROELECTROMECHANICAL SWITCH (MEMS) ANTENNA application cited as a Related Application, above. This application is incorporated herein by reference.

Returning to FIG. 1, a coupler 130 has an input connected to the transmission line 106 and an output connected to the detector input on line 112. The detector 110 converts the coupled signal to a dc voltage and supplies the dc voltage as the detected signal on line 114. A variety of coupler and detector designs are known by those skilled in the art that would be applicable for use in the present invention.

Typically, the detector 110 includes a rectifying diode and a capacitor (not shown). Therefore, the detector 110 has a non-uniform frequency response. In some aspects, the regulator circuit 116 includes a memory 132 with dc voltage measurements cross referenced to the frequencies of coupled signals. Typically, the calibration might be made to create a 0 volt offset at a bandpass center frequency (f1), with plus or minus voltage offsets for frequencies either above or below f1. However, other calibration schemes are possible. Regardless, the regulator circuit 116 supplies a frequency offset control signal on line 108 that is responsive to the reference signal on line 118.

Typically, the coupler 130 has a non-uniform frequency response. In other aspects of the system 100, the regulator circuit 116 includes a memory 134 with coupler signal strength measurements cross referenced to the frequencies of coupled signals. As above, the calibration might be made to create a zero offset at a bandpass center frequency (f1), with plus or minus offsets for frequencies either above or below f1. The offsets could be added either to the detected signal to indirectly modify the control signal, or be added to directly modify the control signal. Regardless, the regulator circuit 116 supplies a frequency offset control signal on line 108 responsive to the reference signal on line 118. The reference signal on line 118 may be an analog voltage that represents the intended antenna operating frequency. Alternately, the reference signal may be a digital representation of the intended antenna operating frequency. Note that the regulator circuit 116 may have mechanisms for calibrating both the detector and the coupler.

In some aspects of the system 100, the regulator circuit 116 includes a memory 136 for storing previous control signal modifications. Than, the antenna active element 104 can be initialized with the stored control signal modifications upon startup. In the context of a wireless telephone, the memory 136 may be used to store the average modification, in response to the user's normal hand position for example. Using the average modification as an initial value may result in greater resource efficiencies.

Figure 4A:
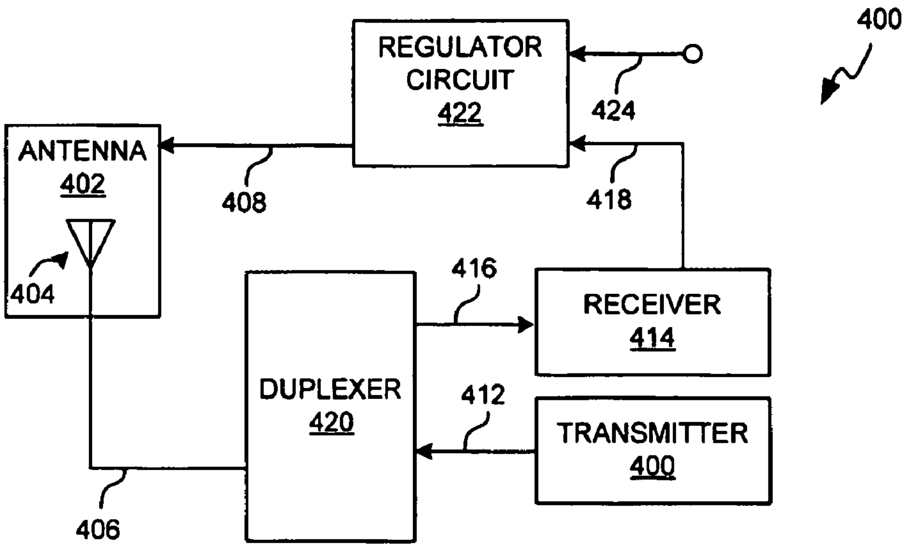
FIG. 4 is a schematic block diagram illustrating variations of the present invention antenna system for regulating the electrical length of an antenna.
Figure 4B:
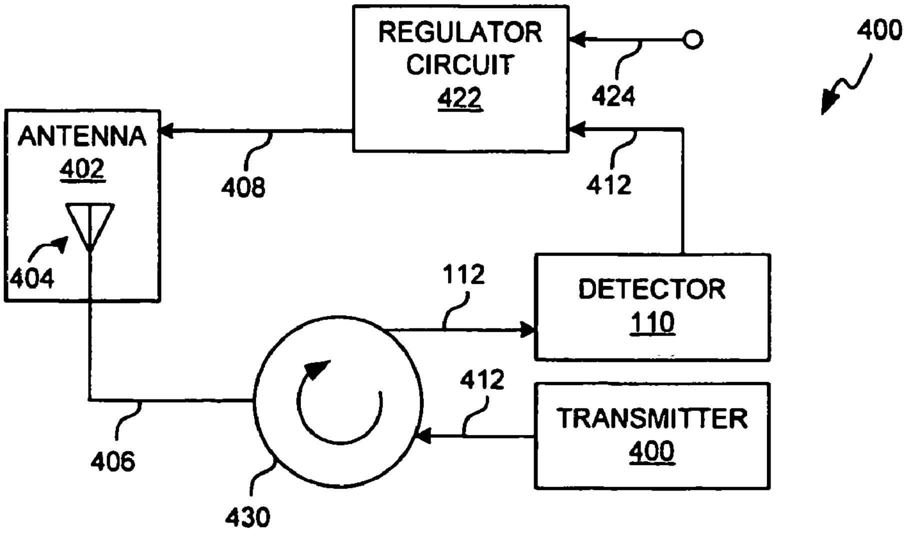

FIGS. 4*a* and 4*b* are schematic block diagrams illustrating variations of the present invention antenna system for regulating the electrical length of an antenna. FIG. 4*a* depicts a time-duplexing transceiver. A time-duplexing transceiving system is understood to be a system where the transmit and receive signals have the same frequency, but are time division multiplexed. For example, the time-duplexing transceiver describes a time division multiple access (TDMA) wireless telephone system protocol. The system 400 comprises an antenna 402 including an active element 404 having an electrical length responsive to a control signal, an antenna port connected to a transmission line 406 to transceive transmission line signals, and a control port connected to the active element 404 and accepting control signals on line 408. A half-duplex transmitter 410 has a port on transmission line 412 to supply a transmission line signal to the antenna port. A half-duplex receiver 414 has an input port on transmission line 416 to receive the transmission line signals reflected from the antenna port and an output port on line 418 to supply an evaluation of received transmission line signal.

The transmitter 410, receiver 414, and antenna 402 are shown connected to a duplexer 420. Then, the receiver 414 measures transmitter signals reflected by the antenna 402, that "leak" through the duplexer. Alternately but not shown, an isolator (or circulator) can have a first port connected to the antenna port on line 406 and a second port connected to the transmitter port on line 412 that is minimally isolated from the first port. The isolator can have a third port connected to the receiver port on line 416 that is minimally isolated from the first port and maximally isolated from the second port.

A regulator circuit 422 has an input connected to the receiver output on line 418 to accept the transmission line signal evaluations and a reference input on line 424 to accept a reference signal responsive to the antenna electrical length, which is in turn related to the frequency of the conducted transmission line signal supplied by the transmitter 410. The regulator circuit 422 has an output connected to the antenna on line 408 to supply the control signal in response to the signal evaluations and the reference signal.

In some aspects, the receiver evaluation is a measurement of the automatic gain control voltage. That is, the receiver 414 supplies an evaluation that is responsive to the signal strength of the received signal. If the antenna is well matched, that is, tuned to operate at the frequency of the conducted transmission line signals receiving from the transmitter, then very little signal is reflected. As a result, when the receiver 414 measures low signal strength reflected power levels, the antenna is properly tuned. The antenna tuning can be improved by searching to find the minimum signal strength level.

Alternately, the receiver may decode the received signal and use the decoded bit error rate (BER) to evaluate the antenna matching. As above, when the antenna is well matched, the reflected signal strength will be low. As a result, the BER rate for a well-matched antenna will be high. The antenna tuning can be improved by searching the find the maximum BER. In another variation, the received demodulated signal can be compared to the (pre-modulated) transmitted signal to evaluate antenna matching. As in the system of FIG. 1, the regulator circuit 422 may include a memory (not shown) with previous antenna modification to use at system initialization.

FIG. 4*b* depicts an isolator 430 having ports connected on lines 412 and 406 to pass transmitted transmission line signals to the antenna port. The isolator 430 also has port on line 112 to supply transmission line signals reflected by the antenna port. The detector 110 is connected to the isolator 430 to accept the reflected transmission line signals. As in FIG. 1, the detector 110 supplies detected signals to the regulator circuit 116, and the regulator circuit 116 generates a control signal in response to the detected signals.

Figure 5A:
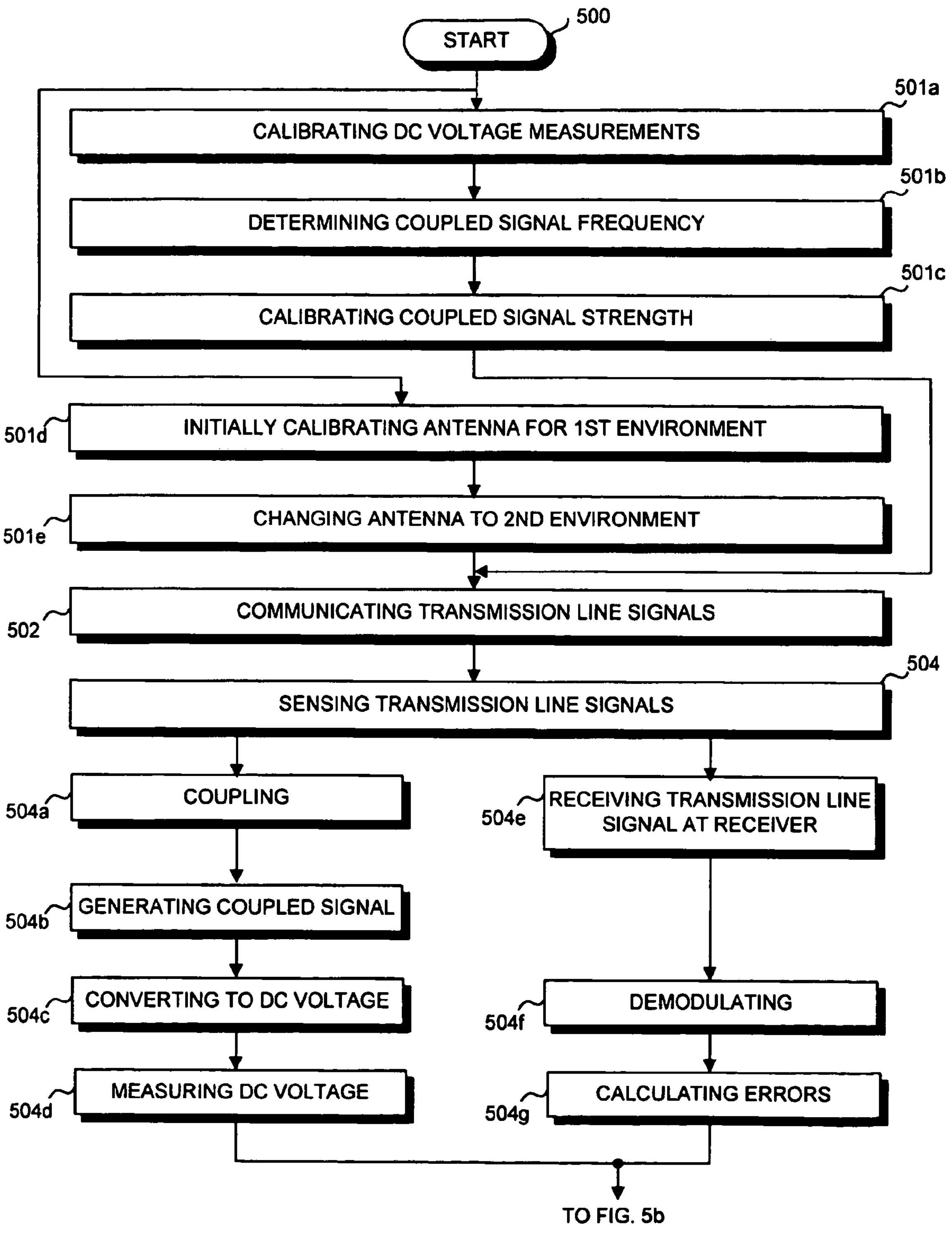
FIGS. 5*a* and 5*b* are flowcharts illustrating the present invention method for regulating the electrical length of an antenna.
Figure 5B:
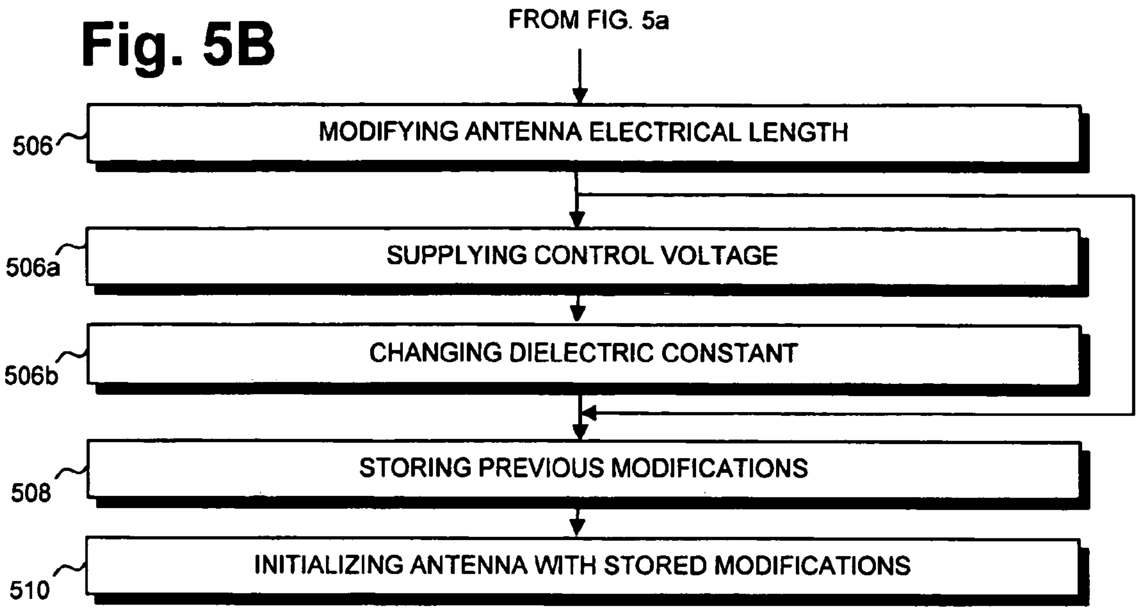

FIGS. 5*a* and 5*b* are flowcharts illustrating the present invention method for regulating the electrical length of an antenna. Although the method (and the method of FIGS. 6 and 7, below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 communicates transmission line signals at a predetermined frequency between a transceiver and an antenna. Step 504 senses transmission line signals. Step 506 modifies the electrical length of an antenna in response to sensing the transmission line signals. In some aspects related to use in a wireless communications device telephone, modifying the antenna electrical length in Step 506 includes modifying the antenna electrical length to operate at a frequency such as 824 to 894 megahertz (MHz), 1850 to 1990 MHz, 1565 to 1585 MHz, or 2400 to 2480 MHz.

In some aspects of the method, sensing transmission line signals in Step 504 includes sensing transmission line signal power levels. In other aspects, modifying the electrical length of the antenna in response to sensing the transmission line signals in Step 506 includes modifying the antenna impedance. Alternately, Step 506 modifies the antenna electrical length by optimizing the transmission line signal strength between the transceiver and the antenna.

In some aspects, the antenna has an antenna port and communicating transmission line signals at a predetermined frequency between a transceiver and an antenna in Step 502 includes accepting the transmission line signal from the transceiver at the antenna port. Then, sensing transmission line signals in Step 504 includes measuring the transmission line signal reflected from the antenna port.

In other aspects, the antenna includes a radiator, a counterpoise, and a dielectric proximately located with the radiator and the counterpoise. Then, modifying the electrical length of the antenna in response to sensing the transmission line signals in Step 506 includes changing the dielectric constant of the dielectric. In one aspect, the antenna dielectric includes a ferroelectric material with a variable dielectric constant. Then, changing the dielectric constant of the dielectric in Step 506 includes substeps. Step 506*a* supplies a control voltage to the ferroelectric material. Step 506*b* changes the dielectric constant of the ferroelectric material in response to changing the control voltage.

In other aspects, the antenna includes a radiator with at least one selectively connectable microelectromechanical switch (MEMS). Then, modifying the electrical length of the antenna in response to sensing the transmission line signals in Step 506 includes changing the electrical length of the radiator in response to connecting the MEMS. In some aspects, the antenna includes a counterpoise with at least one selectively connectable MEMS. Then, modifying the antenna electrical length in Step 506 includes changing the electrical length of the counterpoise in response to connecting the (counterpoise) MEMS.

In other aspects of the method, sensing transmission line signals in Step 504 includes substeps. Step 504*a* couples to the transmission line signal. Step 504*b* generates a coupled signal. Step 504*c* converts the coupled signal to a dc voltage. Step 504*d* measures the magnitude of the dc voltage. In some aspects, the antenna is connected to a transmitter through an isolator. Then, sensing transmission line signals includes detecting the power level of transmitted transmission line signals, through the isolator.

Other aspects of the method include additional steps. Step 501*a* calibrates the dc voltage measurements to coupled signal frequencies. Step 501*b* determines the frequency of the coupled signal. Then, sensing transmission line signals in Step 504 includes offsetting the dc voltage measurements in response to the determined coupled signal frequency. In some aspects, Step 501*c* calibrates coupled signal strength to coupled signal frequency. Then, sensing transmission line signals in Step 504 includes offsetting the dc voltage measurements in response to the determined coupled signal frequency.

Other aspects of the method include additional steps. Step 508 stores previous antenna electrical length modifications. Step 510 initializes the antenna with the stored modifications upon startup.

In some aspects, Step 501*d* initially calibrates the antenna electrical length to communicate transmission line signals with a transceiver in a predetermined first environment of proximate dielectric materials. Step 501*e* changes from the antenna first environment of proximate dielectric materials to an antenna second environment of dielectric materials. Then, sensing transmission line signals in Step 504 includes sensing changes in the transmission line signals due to the antenna second environment. Modifying the electrical length of antenna in Step 506 includes modifying the antenna electrical length in response to the antenna second environment.

In some aspects, the transceiver and antenna are elements of a portable wireless communications telephone. Then, changing from the antenna first environment of proximate dielectric materials to an antenna second environment of dielectric materials in Step 501*e* includes a user manipulating the telephone.

In other aspects of the method, the antenna is connected to a half-duplex transceiver with a transmitter and receiver. Then, sensing transmission line signals in Step 504 includes alternate substeps. Step 504*e* receives the communicated transmission line signals at the receiver. Step 504*f* demodulates the received transmission line signals. Step 504*g* calculates the rate of errors in the demodulated signals, by comparing the received message to the transmitted message, or by using FEC to correct the received message.

Figure 6:
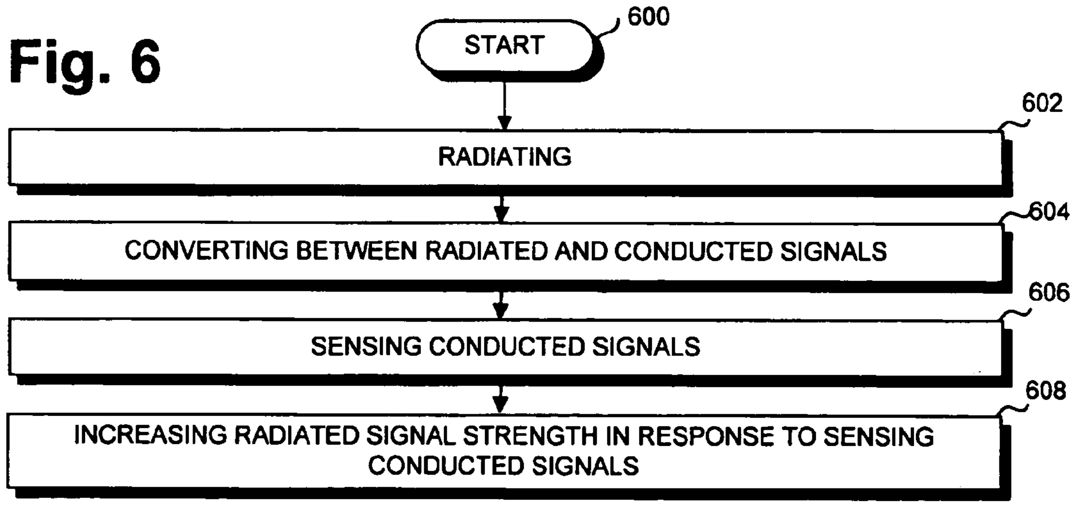
FIG. 6 is a flowchart illustrating the present invention method for controlling the efficiency of a radiated signal.

FIG. 6 is a flowchart illustrating the present invention method for controlling the efficiency of a radiated signal. The method starts at Step 600. Step 602 radiates electromagnetic signals at a predetermined frequency. Step 604 converts between radiated electromagnetic signals and conducted electromagnetic signals. Step 606 senses the conducted signals. Step 608 increases the radiated signal strength in response to sensing the conducted signals.

In some aspects, sensing the conducted signals in Step 606 includes sensing conducted signal power levels. In other aspects, increasing the radiated signal strength in response to sensing the conducted signals in Step 608 includes improving the impedance match at the interface between the radiated and conducted signals. Alternately, it can be stated that Step 608 increases the radiated signal strength by minimizing the signal strength of reflected conducted signals at the interface between radiated and conducted signals.

Figure 7:
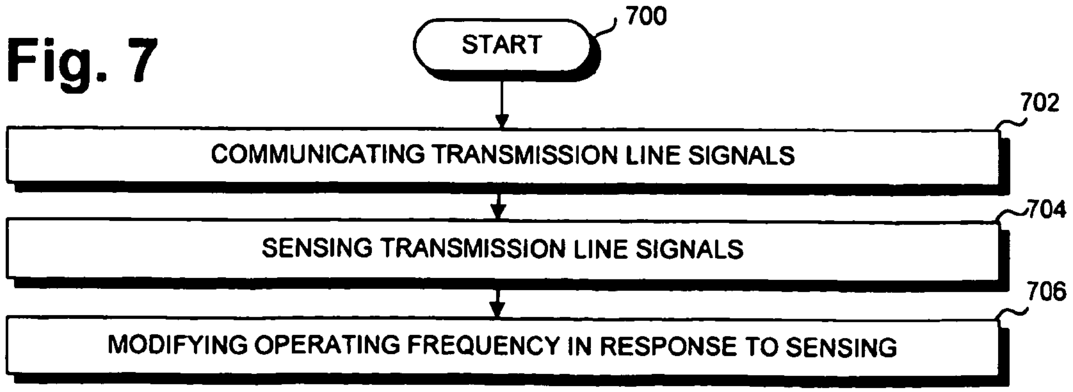
FIG. 7 is a flowchart illustrating the present invention method for regulating the operating frequency of an antenna.

FIG. 7 is a flowchart illustrating the present invention method for regulating the operating frequency of an antenna. The method starts at Step 700. Step 702 communicates transmission line signals at a predetermined frequency between a transceiver and an antenna. Step 704 senses transmission line signals. Step 706 modifies the antenna operating frequency in response to sensing the transmission line signals.

A system and method have been provided for altering the operating frequency of a wireless device antenna in response to sensing the antenna mismatch. Examples have been given of sensing techniques to illustrate specific applications of the invention. However, the present invention is not limited to merely the exemplary sensing means. Likewise, examples have been given of antennas that have selectable electrical lengths. However, once again the invention is not limited to any particular antenna style. Finally, although the invention has been introduced in the context of a wireless telephone system, it has broader implications for any system using an antenna for radiated communications. Other variations and embodiments of the invention will occur to those skilled in the art.

I claim:

1. A method for dynamically tuning an antenna in a wireless communication device, the method comprising:

transmitting communication signals over a transmission line at a predetermined frequency between a transceiver and an antenna;

sensing transmission line signals reflected from the antenna, the sensing the transmission line signals further comprising:

coupling to the transmission line signal, generating a coupled signal, converting the coupled signal to a DC voltage, the DC voltage having a magnitude, and measuring the magnitude of the DC voltage; and, modifying an electrical length of the antenna in response to sensing the transmission line signals, the transmission line signals being a reflection of the communication signals.

2. The method of claim 1 wherein the sensing transmission line signals comprises sensing transmission line signal power levels.

3. The method of claim 1 in which the antenna is connected to a transmitter through an isolator;

wherein the sensing the transmission line signals includes detecting a power level of transmitted transmission line signals, through the isolator.

4. The method of claim 1 wherein the modifying the electrical length of the antenna comprises modifying an antenna impedance.

5. The method of claim 1 wherein the modifying the electrical length of the antenna comprises decreasing the signals reflected from the antenna.

6. The method of claim 1 in which the antenna comprises a radiator, a counterpoise, and a variable dielectric proximately located with the radiator and the counterpoise;

wherein the modifying the electrical length of the antenna comprises changing a dielectric constant of the dielectric.

7. The method of claim 6 in which the antenna dielectric further comprises a ferroelectric material with a variable dielectric constant;

wherein the changing the dielectric constant of the dielectric comprises:

supplying a control voltage to the ferroelectric material, and changing the dielectric constant of the ferroelectric material in response to changing the control voltage.

8. The method of claim 1 in which the antenna comprises a radiator with at least one selectively connectable microelectromechanical switch (MEMS);

wherein the modifying the electrical length of the antenna comprises changing the electrical length of the radiator via MEMS switching.

9. The method of claim 8 in which the antenna further comprises a counterpoise with at least one selectively connectable MEMS;

wherein the modifying the electrical length of the antenna further comprises changing the electrical length of the counterpoise via MEMS switching.

10. The method of claim 1 further comprising:

calibrating DC voltage measurements to coupled signal frequencies;

determining the frequency of the coupled signal;

wherein the sensing the transmission line signals further comprises offsetting the DC voltage measurements in response to the determined coupled signal frequency.

11. The method of claim 1 further comprising:

calibrating coupled signal strength to coupled signal frequency;

determining the frequency of the coupled signal;

wherein the sensing the transmission line signals further comprises offsetting the DC voltage measurements in response to the determined coupled signal frequency.

12. The method of claim 1 further comprising:

storing previous antenna electrical length modifications; and, initializing the antenna with the stored modifications upon startup.

13. The method of claim 1 further comprising:

initially calibrating the antenna electrical length to communicate transmission line signals with a transceiver in a predetermined first environment of proximate dielectric materials; and changing from the antenna first environment of proximate dielectric materials to an antenna second environment of dielectric materials;

wherein the sensing the transmission line signals includes sensing changes in the transmission line signals due to the antenna second environment; and, wherein the modifying the electrical length of the antenna comprises modifying the electrical length of the antenna in response to the antenna second environment.

14. The method of claim 13 wherein changing from the antenna first environment of proximate dielectric materials to an antenna second environment of dielectric materials includes a user manipulating the wireless communication device.

15. The method of claim 1 wherein the transceiver comprises: a duplexer, a half-duplex transmitter, and a half-duplex receiver;

wherein the sensing the transmission line signals comprises: receiving the communicated transmission line signals at the receiver, demodulating the received transmission line signals, and calculating a rate of errors in the demodulated signals.

16. An antenna tuning system for a mobile wireless communication device comprising:

an antenna comprising: an active element having a variable electrical length responsive to control signals, an input impedance that varies in response to chances in the active element electrical length, an antenna port configured to communicate electromagnetic communication signals, and a control port connected to the active element to accept the control signals;

a transmission line communicably connected to the antenna port;

a transceiver communicably connected to the transmission line, and configured to receive and transmit the communication signals via the transmission line;

a detector having an input operatively connected to the transmission line, and configured to sense signals on the transmission line responsive to changes in the antenna port impedance, the sensed signals being a reflection of the communication signals;

a regulator circuit having an input connected to the detector and configured to supply the control signals in response to the transmission line signals; and a control line connected to the regulator circuit and the control port of the antenna, and configured to supply the control signals to the antenna.

17. The system of claim 16 further comprising a reference line;

wherein the regulator circuit has a reference input on the reference line to accept a reference signal responsive to a predetermined antenna operating frequency, and is configured to supply control signals in response to the detected signals and the reference signal.

18. The system of claim 17 wherein the detector is configured to sense power levels of reflected transmission line signals.

19. The system of claim 17 wherein the detector senses the transmission line signals supplied by the transceiver and reflected from the antenna port; and wherein the regulator circuit is further configured to supply the control signals in response to decreasing the transmission line signals reflected from the antenna port.

20. The system of claim 17 wherein the antenna active element comprises: a counterpoise, a dielectric, proximately located with the counterpoise, with a dielectric constant responsive to the control signal, and, a radiator with an electrical length responsive to changes in the dielectric constant.

21. The system of claim 20 wherein the dielectric comprises a ferroelectric material with a variable dielectric constant that changes in response to changes in control signal voltage levels.

22. The system of claim 17 wherein the antenna active element comprises: a first selectively connectable microelectromechanical switch (MEMS) responsive to the control signal; and, a radiator with an electrical length that varies in response to selectively connecting the MEMS.

23. The system of claim 22 wherein the antenna active element comprises: a second selectively connectable MEMS responsive to the control signal, and a counterpoise with an electrical length that varies in response to selectively connecting the second MEMS.

24. The system of claim 17 further comprising:

a coupler having an input connected to the transmission line and an output connected to the detector input;

wherein the detector is configured to convert signals from the coupler to a DC voltage, and to supply the DC voltage as the detected signal.

25. The system of claim 24 wherein the regulator circuit comprises a memory with DC voltage measurements cross referenced to the frequencies of coupled signals, configured to supply a frequency offset control signal responsive to the reference signal.

26. The system of claim 17 wherein the regulator circuit comprises a memory with coupler signal strength measurements cross referenced to the frequencies of coupled signals, configured to supply a frequency offset control signal responsive to the reference signal.

27. The system of claim 17 wherein the regulator circuit comprises a memory for storing previous control signal modifications, configured to initialize the antenna active element with the stored control signal modifications upon startup.

28. The system of claim 17 further comprising:

an isolator having ports configured to pass transmitted transmission line signals to the antenna port, and a port configured to supply transmission line signals reflected by the antenna port;

wherein the detector is connected to the isolator to accept the reflected transmission line signals.

29. The system of claim 17 wherein the transceiver comprises: a duplexer, a half-duplex transmitter, a half-duplex receiver, an output port to supply the transmission line signals supplied by the half-duplex transmitter and reflected from the antenna port.

30. An antenna tuning system for a mobile wireless communication device comprising:

an antenna comprising: an active element having a variable electrical length responsive to control signals, an antenna port configured to communicate electromagnetic communication signals, and a control port connected to the active element to accept the control signals;

a transmission line communicably connected to the antenna port;

a transceiver communicably connected to the transmission line, and configured to receive and transmit the communication signals via the transmission line;

a detector having an input operatively connected to the transmission line, and configured to sense signals on the transmission line, the sensed signals being a reflection of the communication signals;

a coupler having an input connected to the transmission line and an output connected to the detector input, the detector configured to convert signals from the coupler to a DC voltage, and to supply the DC voltage as the detected signal;

a regulator circuit having an input connected to the detector and configured to supply the control signals in response to the transmission line signals; and a control line connected to the regulator circuit and the control port of the antenna, and configured to supply the control signals to the antenna.

31. The system of claim 30 wherein the regulator circuit comprises a memory with DC voltage measurements cross referenced to the frequencies of coupled signals, configured to supply a frequency offset control signal responsive to the reference signal.

32. An antenna tuning system for a mobile wireless communication device comprising:

an antenna comprising: an active element having a variable electrical length responsive to control signals, an antenna port configured to communicate electromagnetic communication signals, and a control port connected to the active element to accept the control signals;

a transmission line communicably connected to the antenna port;

a transceiver communicably connected to the transmission line, and configured to receive and transmit the communication signals via the transmission line;

a detector having an input operatively connected to the transmission line, and configured to sense signals on the transmission line, the sensed signals being a reflection of the communication signals;

a regulator circuit having an input connected to the detector and a memory with coupler signal strength measurements cross referenced to the frequencies of coupled signals, the regulator circuit configured to supply the control signals in response to the transmission line signals and to supply a frequency offset control signal responsive to the reference signal; and a control line connected to the regulator circuit and the control port of the antenna, and configured to supply the control signals to the antenna.

* * * * *